(12) United States Patent
Joblot et al.

(10) Patent No.: US 8,841,749 B2
(45) Date of Patent: Sep. 23, 2014

(54) SEMICONDUCTOR DEVICE COMPRISING A CAPACITOR AND AN ELECTRICAL CONNECTION VIA, AND FABRICATION METHOD

(75) Inventors: Sylvain Joblot, La Tronche (FR); Alexy Farcy, La Ravoire (FR); Jean-Francois Carpentier, Grenoble (FR); Pierre Bar, Grenoble (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 271 days.

(21) Appl. No.: 13/298,823

(22) Filed: Nov. 17, 2011

(65) Prior Publication Data

US 2012/0133021 A1 May 31, 2012

(30) Foreign Application Priority Data

Nov. 30, 2010 (FR) ..................... 10 59919

(51) Int. Cl.
*H01L 21/02* (2006.01)
*H01L 23/58* (2006.01)
(Continued)

(52) U.S. Cl.
CPC .............. *H01L 23/481* (2013.01); *H01L 28/91* (2013.01); *H01L 23/5223* (2013.01); *H01L 2224/14181* (2013.01); *H01L 23/642* (2013.01); *H01L 21/76898* (2013.01)
USPC ........... 257/532; 257/535; 257/621; 438/387; 438/396

(58) Field of Classification Search
CPC ...................................... H01L 28/40

USPC .................. 257/532, 535, 621; 438/387, 396
See application file for complete search history.

(56) References Cited

U.S. PATENT DOCUMENTS

| 2004/0108587 A1 | 6/2004 | Chudzik et al. |
| 2006/0001174 A1 | 1/2006 | Matsui |
| 2008/0113505 A1 | 5/2008 | Sparks et al. |
| 2008/0173993 A1 | 7/2008 | Andry et al. |

(Continued)

FOREIGN PATENT DOCUMENTS

JP   08097367   4/1996

OTHER PUBLICATIONS

French Search Report and Written Opinion for FR1059919 dated Jun. 27, 2011 (10 pages).
Takada JP0897367A English Translation.

*Primary Examiner* — Evan Pert
(74) *Attorney, Agent, or Firm* — Gardere Wynne Sewell LLP

(57) ABSTRACT

A main blind hole is formed in a front face of a wafer having a rear face. A through capacitor is formed in the main blind hole including a conductive outer electrode, a dielectric intermediate layer, and a filling conductive material forming an inner electrode. Cylindrical portions of the outer electrode, the dielectric intermediate layer and the inner electrode have front ends situated in a plane of the front face of the wafer. A secondary rear hole is formed in the rear face of the wafer to reveal a bottom of the outer electrode. A rear electrical connection is made to contact the bottom of the outer electrode through the secondary rear hole. A through hole via filled with a conductive material is provided adjacent the through capacitor. An electrical connection is made on the rear face between the rear electrical connection and the through hole via.

24 Claims, 17 Drawing Sheets

(51) Int. Cl.
*H01L 49/02* (2006.01)
*H01L 23/64* (2006.01)
*H01L 23/48* (2006.01)
*H01L 21/768* (2006.01)
*H01L 23/522* (2006.01)

(56) References Cited

U.S. PATENT DOCUMENTS

| | | |
|---|---|---|
| 2009/0267183 A1 | 10/2009 | Temple et al. |
| 2010/0032808 A1 | 2/2010 | Ding et al. |
| 2010/0041203 A1 | 2/2010 | Collins et al. |
| 2010/0230806 A1 | 9/2010 | Huang et al. |

SEMICONDUCTOR DEVICE COMPRISING A CAPACITOR AND AN ELECTRICAL CONNECTION VIA, AND FABRICATION METHOD

PRIORITY CLAIM

The present application claims priority from French Application for Patent No. 1059919 filed Nov. 30, 2010, the disclosure of which is hereby incorporated by reference.

TECHNICAL FIELD

The present invention relates to the field of semiconductor devices.

BACKGROUND

It is known, in particular from the United States Patent Application Publication No. 2008/0173993 (the disclosure of which is hereby incorporated by reference), to produce, via the front face of a substrate provided with integrated circuits, capacitors in a blind hole of the substrate, the electrodes of which extend into the substrate and have, above the front face of the substrate, portions extending radially to the blind hole and linked to the integrated circuits. The proposed structure provides only for this type of electrical connection for the capacitor.

There is a need to reduce the distances of the electrical connections and the electrical resistances, and/or a need to increase the integration densities and/or a need to increase the developed surface areas of the capacitors.

A semiconductor device is proposed that addresses the foregoing needs.

SUMMARY

The device may comprise a wafer having a front face and a rear face and in which is formed a main blind hole in its front face.

The device may comprise a through capacitor formed in the main blind hole and comprising a conductive outer layer covering the side wall and the bottom of the main blind hole and forming an outer electrode, a dielectric intermediate layer covering the side wall and the bottom of the outer layer forming a dielectric membrane, and a filling conductive material, at least partially filling the dielectric intermediate layer and forming an inner electrode, so that the cylindrical portions of the outer electrode, of the dielectric intermediate layer and of the inner electrode have front ends situated in the plane of the front face of the wafer.

The device may also comprise a secondary rear hole formed in the rear face of the wafer, at least partially revealing the bottom of the outer electrode.

The device may comprise a rear electrical connection means in contact on the bottom of the outer electrode through the secondary rear hole.

The device may also comprise a main through hole passing through the wafer and situated at a distance from the main blind hole containing the through capacitor, a filling conductive material filling the main through hole so as to form an electrical connection through via having a front end situated in the plane of the front face of the wafer and a rear end situated in the plane of the rear face of the wafer.

The diameter of the through hole containing the electrical connection through via may be greater than the diameter of the blind hole containing the capacitor.

The device may also comprise another main blind hole situated at a distance from the main blind hole containing the through capacitor, a filling conductive material filling this other main hole so as to form an electrical connection via having a front end situated in the plane of the front face of the wafer, another secondary rear hole formed in the rear face of the wafer, at least partially revealing the bottom of this electrical connection via and another rear electrical connection means being in contact on the bottom of this other electrical connection via.

The device may comprise a rear electrical connection means linking the through via and the outer electrode of the capacitor.

The device may comprise a front electrical connection means linking the through via and a front external electrical connection element.

The device may comprise a rear electrical connection means passing through the secondary rear hole and linking the outer electrode of the capacitor to a rear external electrical connection element.

The device may comprise a front electrical connection means linking the inner electrode of the capacitor and a front external electrical connection element.

The wafer may comprise a substrate on a front face of which are formed integrated circuits and a dielectric layer formed on the front face of the substrate.

The device may comprise a front electrical connection means linking the inner electrode of the capacitor and the integrated circuits.

The device may comprise a front electrical connection means linking the through via and the integrated circuits.

There is also proposed a method for fabricating a semiconductor device containing a capacitor.

The method comprises: producing a main blind hole in a front face of a wafer; successively depositing on the front face of the substrate and in the main blind hole a first conductive layer, a dielectric layer and a second conductive layer at least partially filling the dielectric layer in the blind hole; removing the portions of the first layer, of the dielectric layer and of the second conductive layer by leaving the portions of these layers remaining in the blind hole so that these portions have front ends in the plane of the front face of the wafer; and producing a secondary rear hole in the wafer to at least partially reveal the bottom of the portion of the first conductive layer situated in the main blind hole.

There is also proposed a method for fabricating a semiconductor device containing a capacitor and an electrical connection via.

The method comprises: producing, in a front face of a wafer comprising a substrate provided with front integrated circuits and a front dielectric layer, a first main blind hole and a second main blind hole; successively depositing, on the front face of the wafer and in the main blind holes, a first conductive layer, a dielectric layer and a second conductive layer at least partially filling the dielectric layer in the blind hole; removing the portions of the first conductive layer, of the dielectric layer and of the second conductive layer by leaving portions of these layers remaining in the main blind holes, so that these portions have front ends in the plane of the front face of the substrate; reducing the thickness of the wafer by removing a rear portion of this wafer to transform the main blind holes into main holes passing through the wafer; depositing, on the rear face of the reduced wafer, a dielectric rear layer; reducing the thickness of the dielectric rear layer; and producing a rear secondary through hole in the dielectric rear layer so as to at least partially reveal the bottom of the remaining portion of the first conductive layer of the first main hole so as to form a through capacitor, while a via is formed in the second main hole.

The dielectric layer may not extend into the second main blind hole.

The method may comprise the production of front and rear electrical connection means for the through capacitor.

The method may comprise the production of front and rear electrical connection means for the electrical connection via.

BRIEF DESCRIPTION OF THE DRAWINGS

Semiconductor devices and their fabrication method will now be described by way of nonlimiting examples, illustrated by the drawing in which.

DETAILED DESCRIPTION OF THE DRAWINGS

Figure 14:
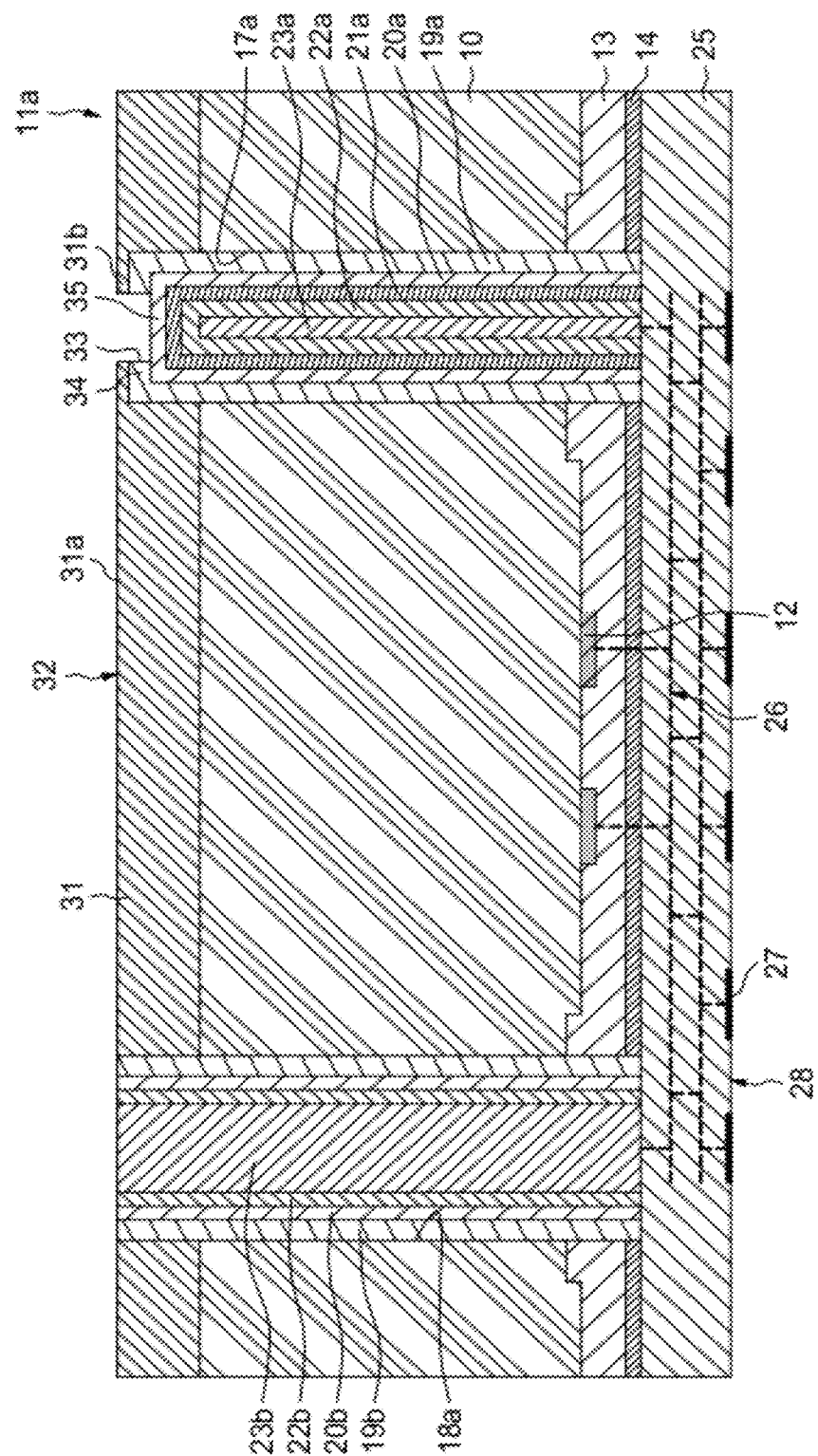
Figure 15:
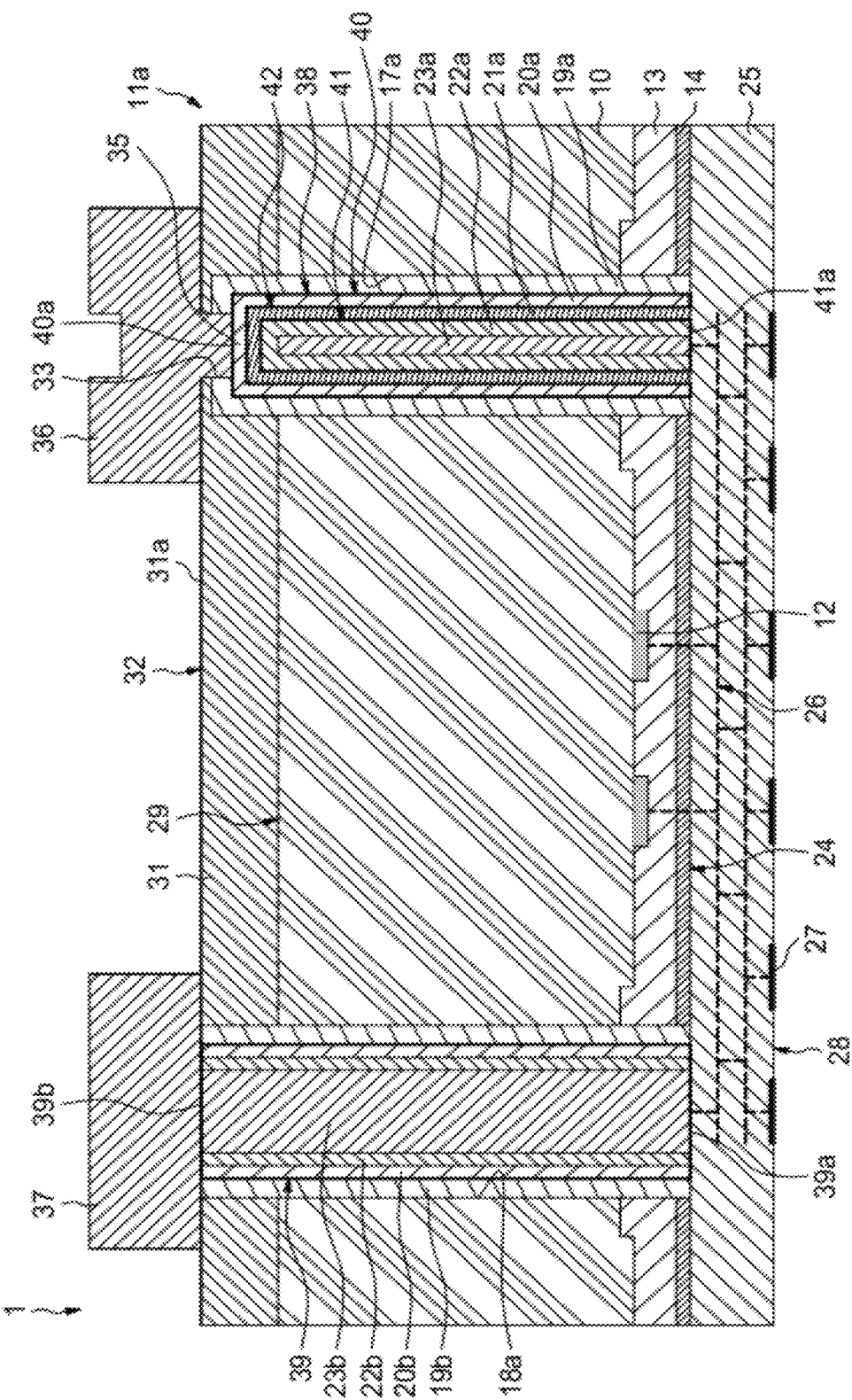
FIG. 15 shows in cross section a semiconductor device that is obtained.

Referring to FIGS. 1 to 14, there now follows a description of the successive steps for fabricating a semiconductor device 1 as illustrated in FIG. 15.

Figure 1:
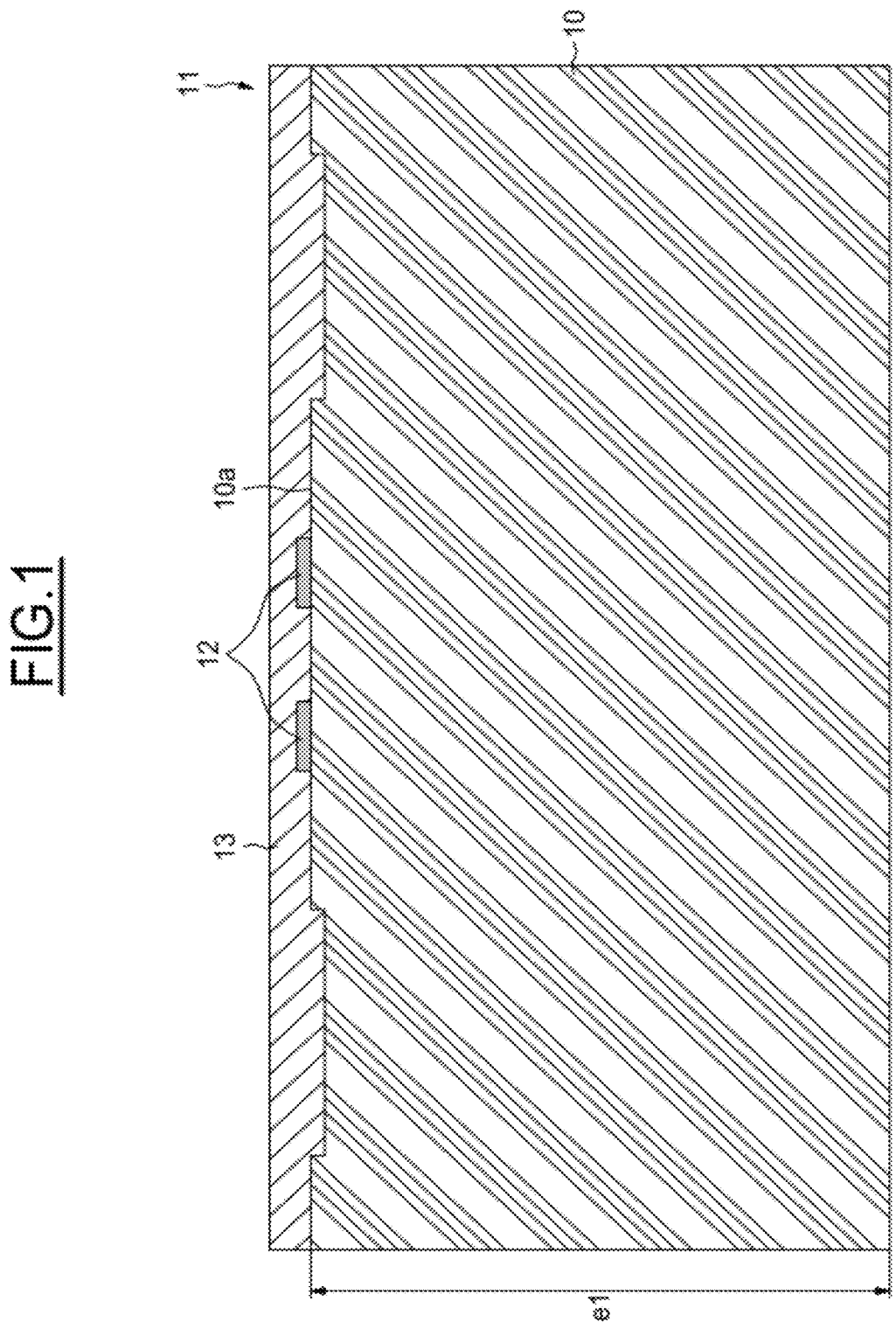
FIGS. 1 to 14 show in cross section steps in the fabrication of a semiconductor device.

As illustrated in FIG. 1, starting with a thick substrate 10, for example made of silicon, having a thickness e1, on a front face 10a of which there have been produced, beforehand, integrated circuits 12 which do not occupy its entire surface, and there is deposited on this front face 10a a layer 13 of a dielectric material, for example of silicon oxide ($SiO_2$) or of silicon nitride (SiN). A wafer 11 is then obtained.

Figure 2:
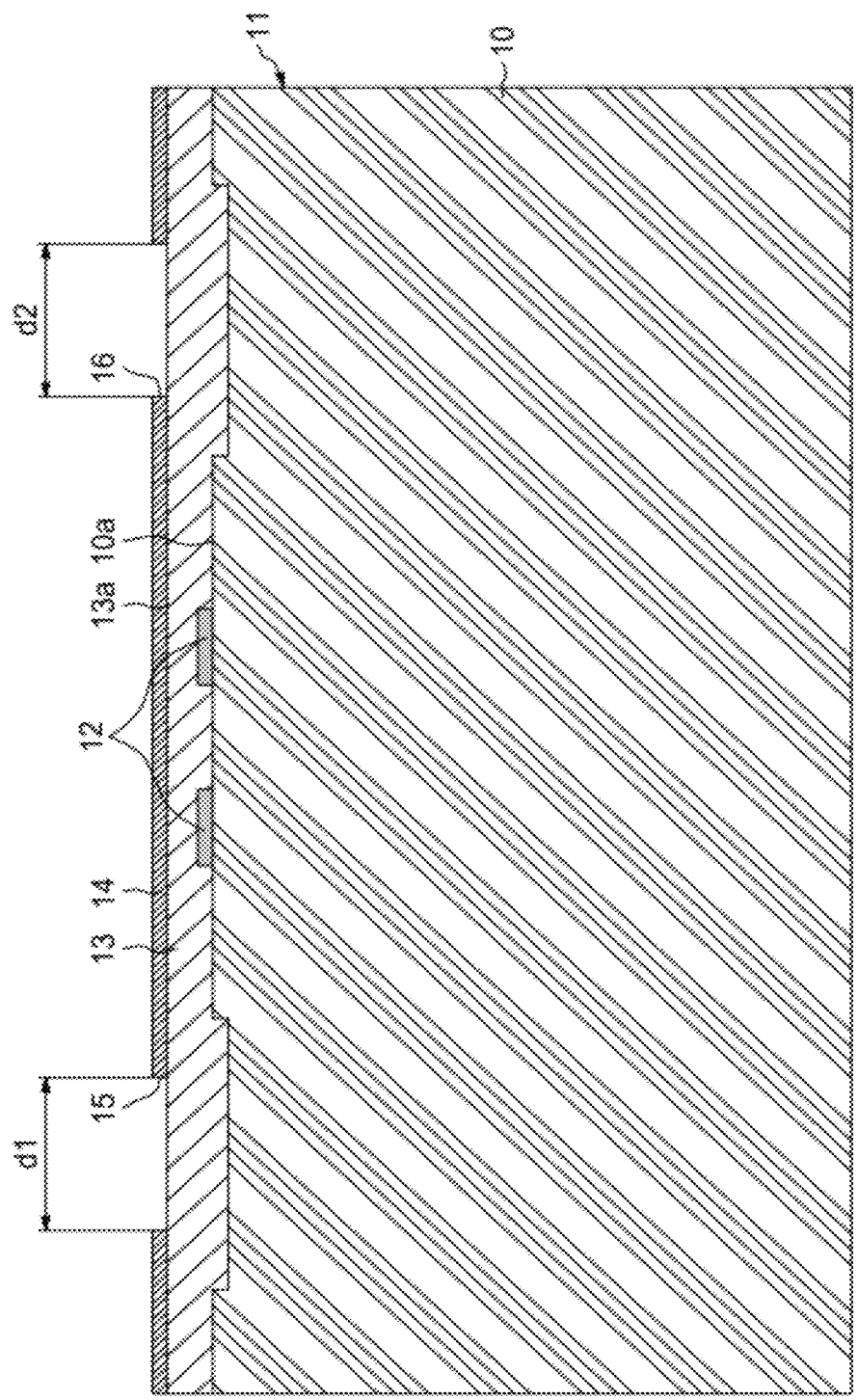

Then, as illustrated in FIG. 2, there is deposited on the front face 13a of the dielectric layer 13 another layer 14 of a dielectric material, for example of silicon oxide ($SiO_2$), of silicon carbonitride (SiCN), or of silicon nitride (SiN), or of amorphous carbon ($\alpha$-C), so as to form a polishing barrier layer, possibly sacrificial, and a barrier to diffusion.

Then, this dielectric layer 13 is etched so as to form circular openings 15 and 16 in places that are not situated above integrated circuits 12, the opening 15 having a diameter d1 smaller than the diameter d2 of the opening 16.

Figure 3:
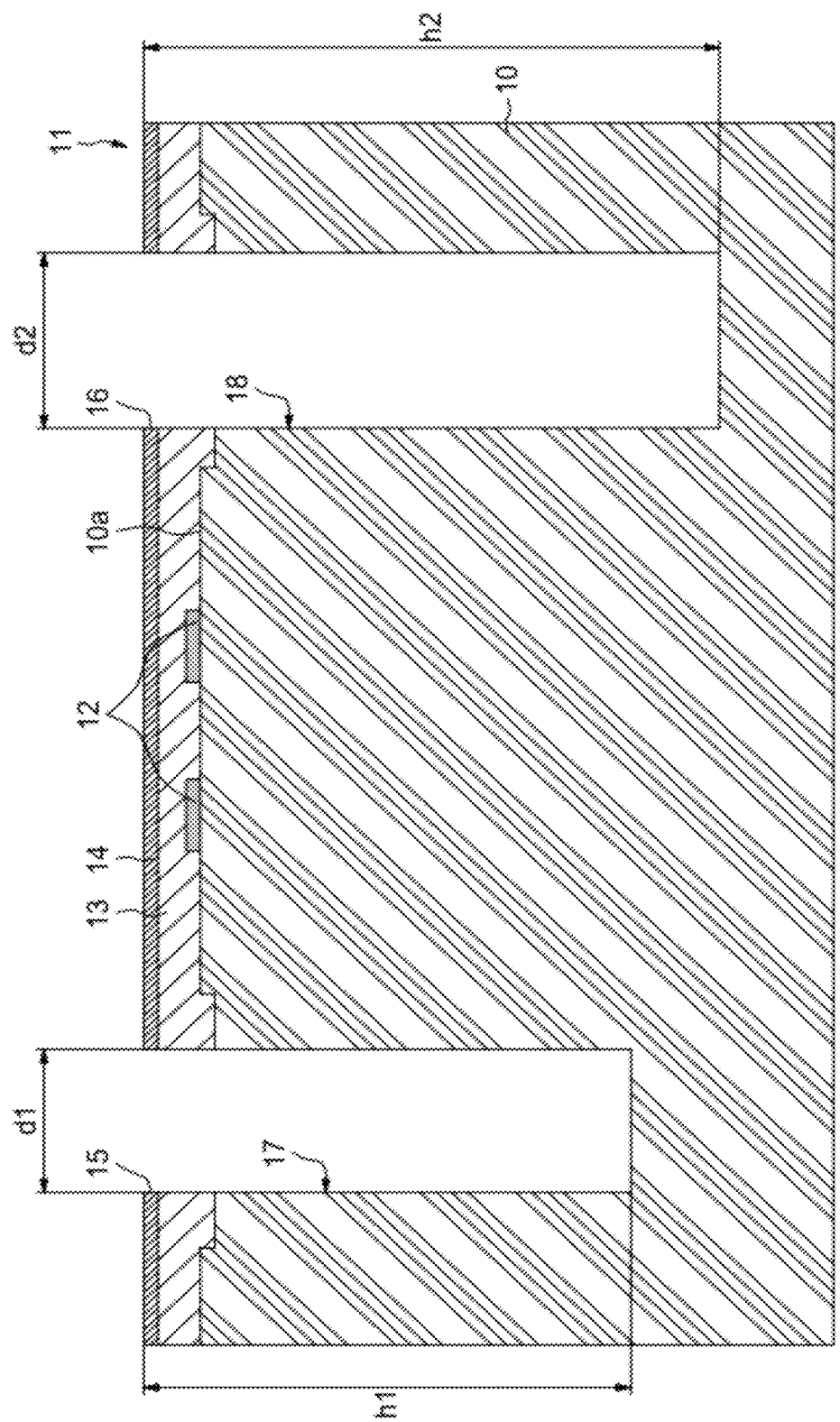

Then, as illustrated in FIG. 3, first and second blind holes 17 and 18, of relatively great depths, are produced through the openings 15 and 16, for example by etching. Since the diameter d1 of the hole 17 is smaller than the diameter d2 of the hole 18, the result of the simultaneous etching attack method is that the depth h1 of the hole 17 is smaller than the depth h2 of the hole 18.

Figure 4:
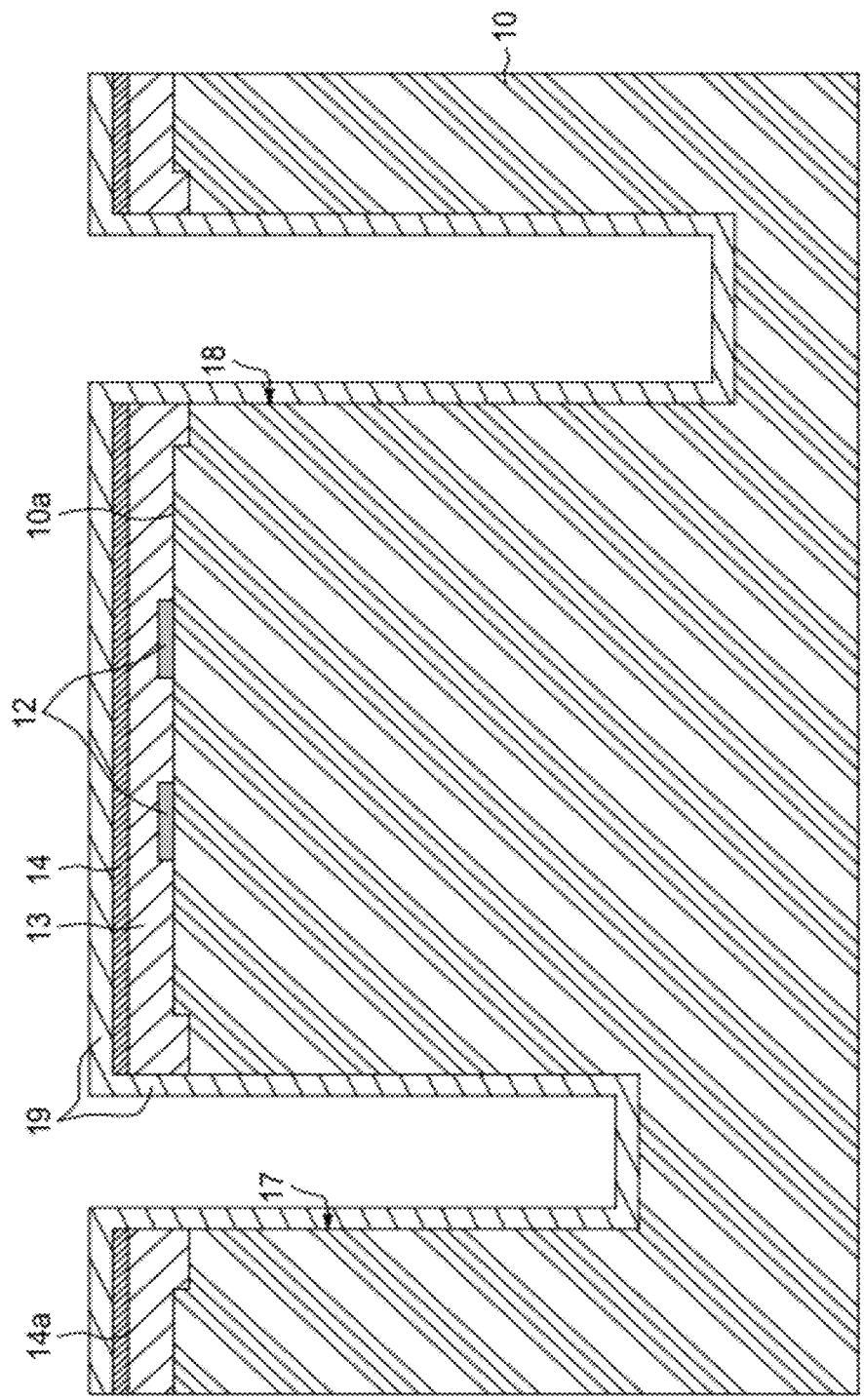

Then, as illustrated in FIG. 4, a layer 19 of a dielectric material, for example of silicon oxide ($SiO_2$), is deposited, which, continuously, covers the front face 14a of the remaining dielectric layer 14, and the walls and the bottoms of the blind holes 17 and 18, so as to form an insulation for the sides.

Figure 5:
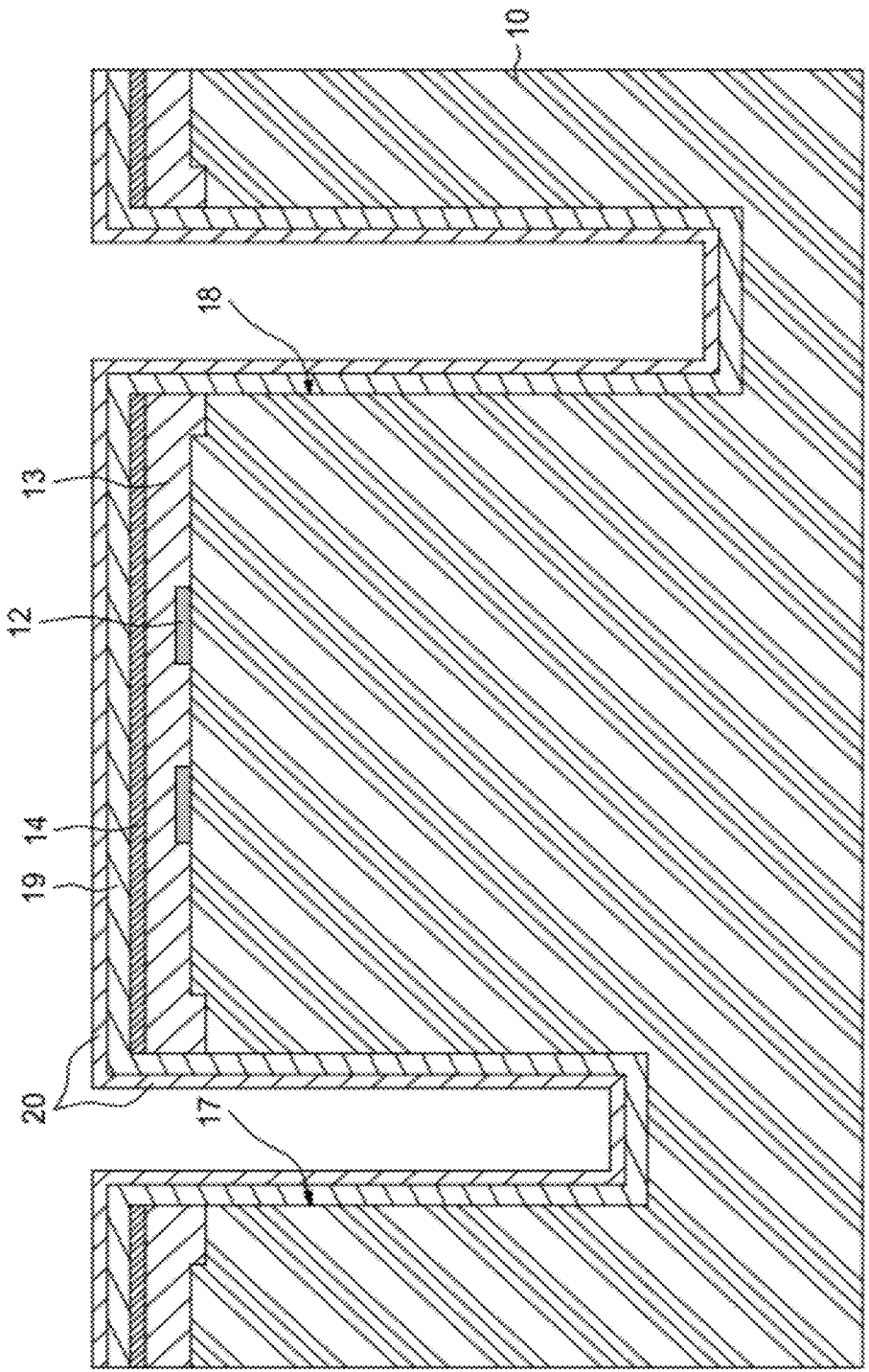

Then, as illustrated in FIG. 5, a layer 20 of an electrically conductive material, for example of titanium nitride (TiN), is deposited, which, continuously, covers the dielectric layer 19, on the front and in the holes 17 and 18.

Figure 6:
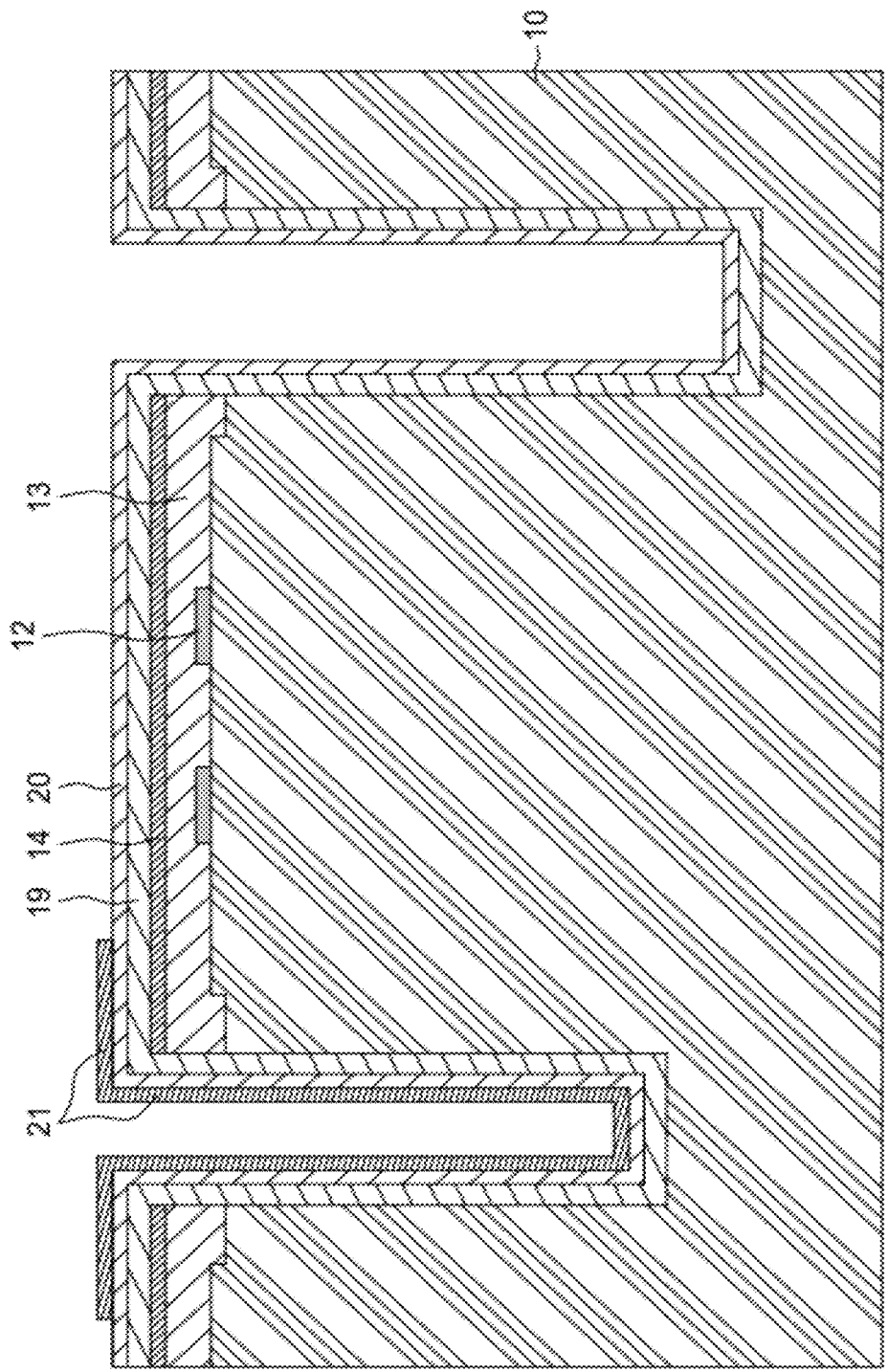

Then, as illustrated in FIG. 6, a layer 21 of a dielectric material, for example of silicon oxide ($SiO_2$), of tantalum oxide ($Ta_2O_5$), of zirconium oxide ($ZrO_2$), of aluminum oxide ($Al_2O_3$) or similar, is deposited, and this dielectric layer can be etched so that this dielectric layer 21 covers the dielectric layer 20 only in the hole 17 and possibly around this hole 17, without it covering the layer 20 in the hole 18 and possibly around this hole 18.

Figure 7:
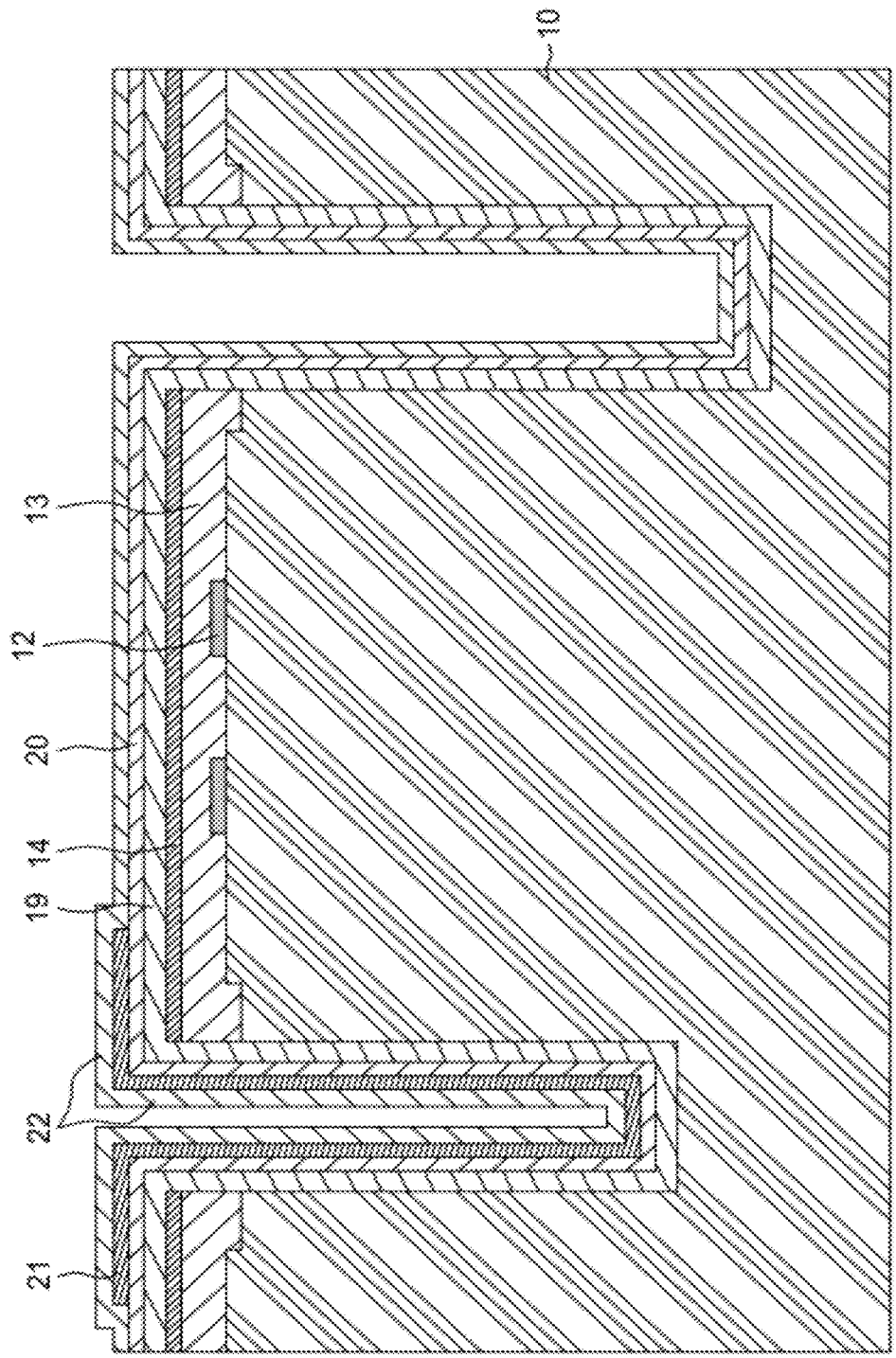

Then, as illustrated in FIG. 7, a layer 22 of an electrically conductive material, for example of titanium nitride (TiN), of tantalum nitride (TaN) or similar, is deposited, which, continuously, covers the uncovered portion of the conductive layer 20 and the dielectric layer 21 partially covering the conductive layer 20, in front and in the holes 17 and 18, this conductive layer 22 forming an anti-diffusion and/or adhesion barrier.

Figure 8:
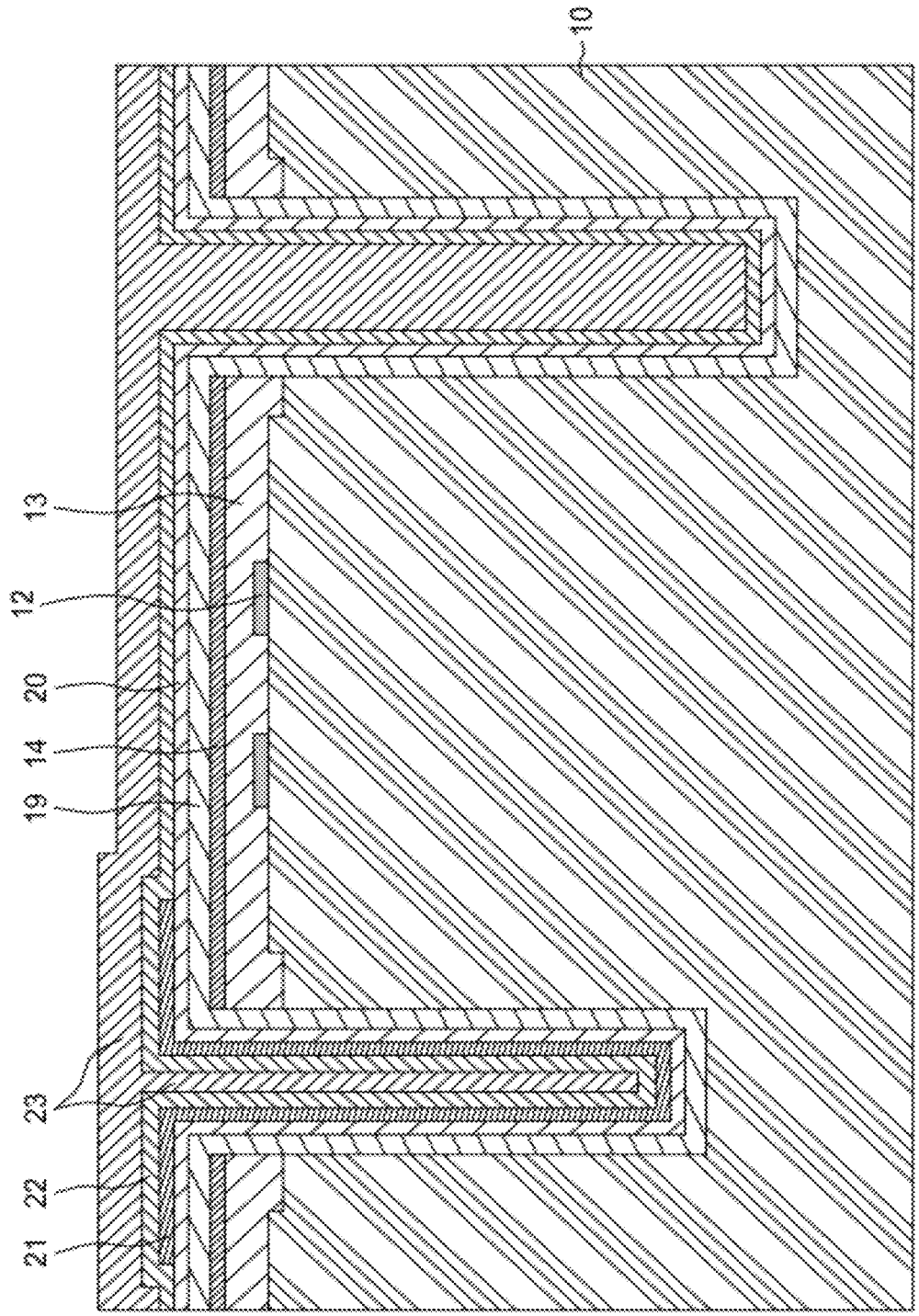

Then, as illustrated in FIG. 8, a thick layer 23 of an electrically conductive material, for example of copper (Cu), of aluminum (Al) or similar, is deposited, which covers the conductive layer 22 and at the same time at least partially fills the holes that remain in the holes 17 and 18. Nevertheless, the dielectric layer 21 can be maintained as it will be etched during the steps of FIGS. 9 and 13.

The result of the above is that the layers 19, 20, 21 and 22 comprise front portions superposed on the layer 14, concentric cylindrical portions in the main blind holes 17 and 18 and radial portions superposed in the bottoms of the holes 17 and 18, whereas the layer 23 has a front portion on the layer 22 and cylinders in the cylindrical portions of the layer 22, in the holes 17 and 18.

Figure 9:
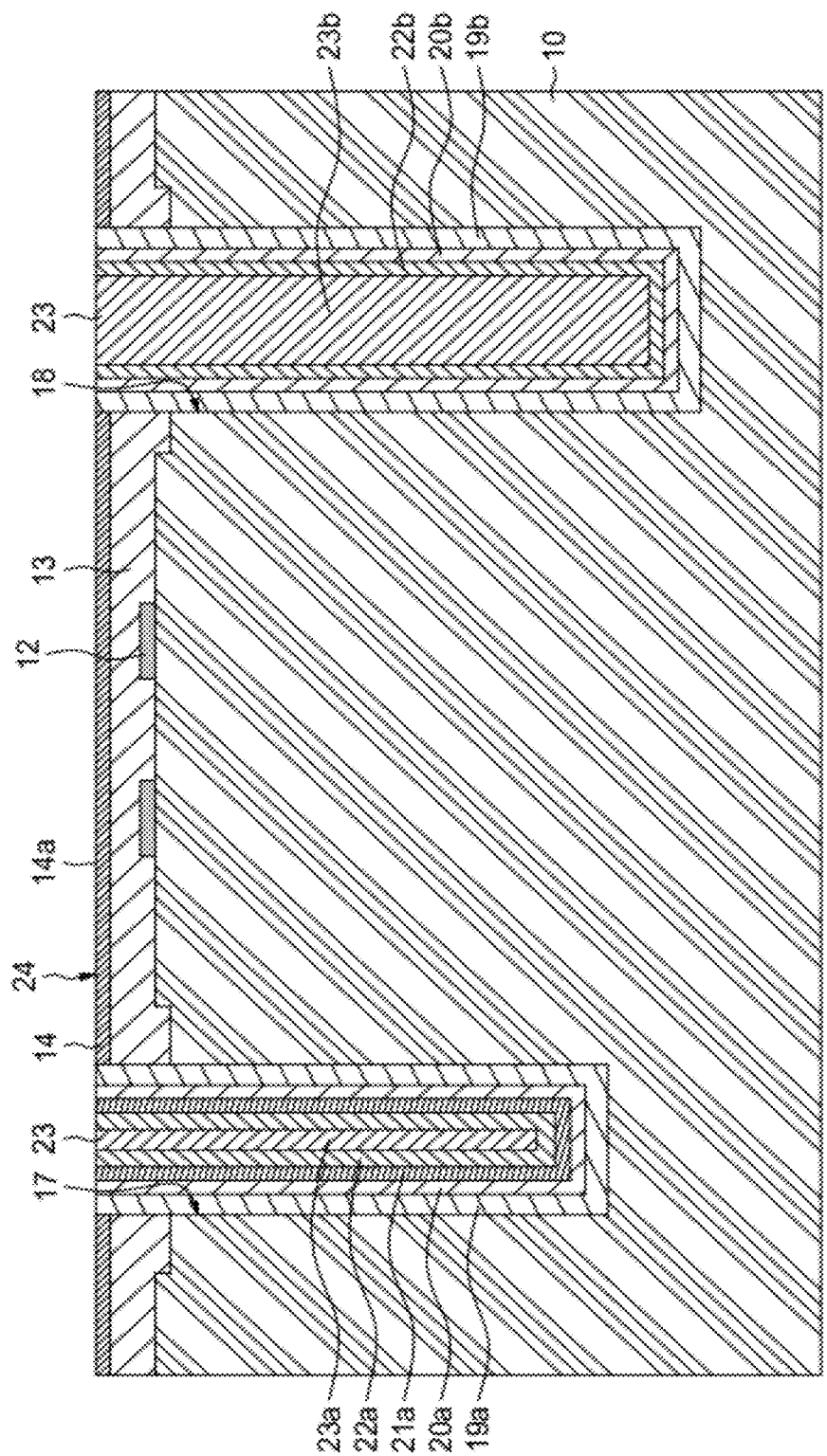

Then, as illustrated in FIG. 9, the excess portions of the layers 19, 20, 21, 22 and 23 previously formed on the dielectric layer 14 are totally removed, for example by mechanochemical polishing, so as to form a flat front face 24.

There then remain, on the one hand in the first hole 17, remaining portions 19a, 20a, 21a, 22a and 23a of the layers 19, 20, 21, 22 and 23, and, on the other hand, in the second hole 18, remaining portions 19b, 20b, 22b and 23b of the layers 19, 20, 21, 22 and 23. Thus, the front ends of the remaining portions 19a, 20a, 21a, 22a and 23a and of the remaining portions 19b, 20b, 22b and 23b and the front face 14a of the dielectric layer 14 form the flat front face 24.

In a variant, it would also be possible to remove the dielectric layer 14 so as to form a flat front face coinciding with the front face 13a of the dielectric layer 13.

Figure 10:
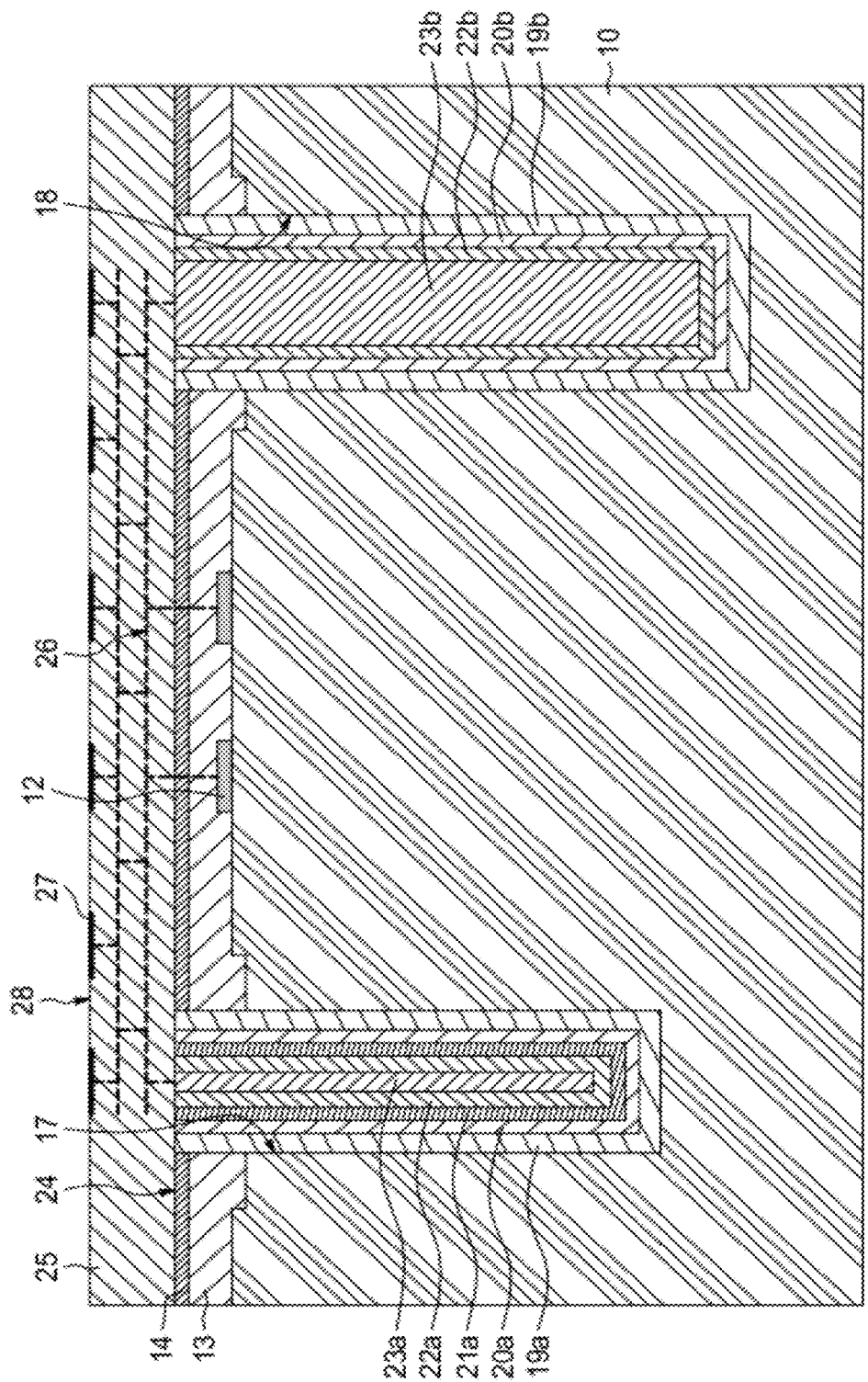

Then, as illustrated in FIG. 10, a dielectric layer 25, possibly multilayer, incorporating an electrical connection network 26, is produced on the flat front face 24, so as to selectively link:

the integrated circuits 12, through the layers 13 and 14, electrical connection bonding pads 27 formed in the front face 28 of the dielectric layer 25, the front end faces of the conductive portions 22a and 23a remaining in the hole 17, and the front end faces of the conductive portions 20b, 22b and 23b remaining in the hole 18.

Figure 11:
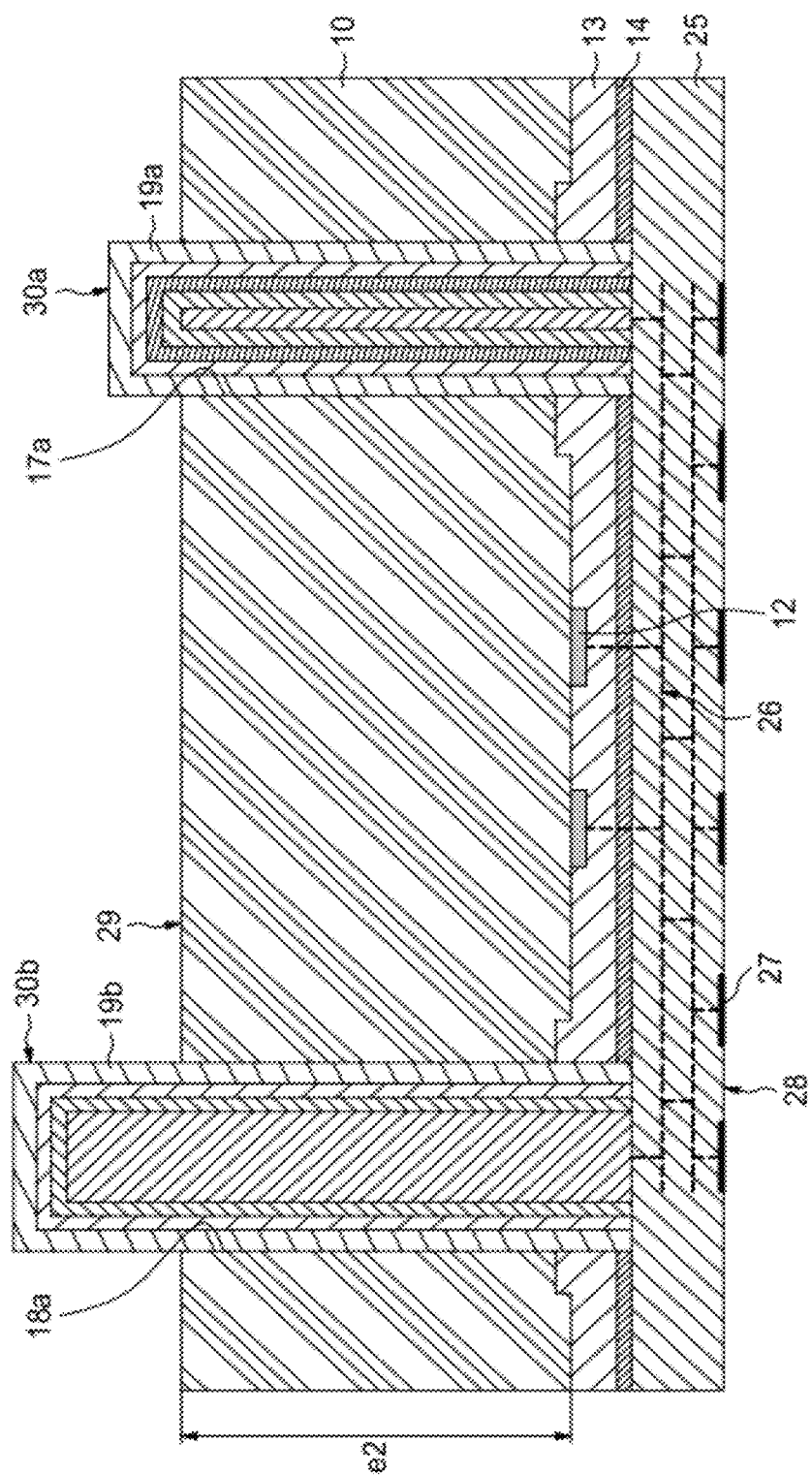

Then, as illustrated in FIG. 11, the thickness of the silicon substrate 10 is reduced, from the rear, so that the thickness e2 of the substrate 10 is such that the holes 17 and 18, previously blind, become main through holes 17a and 18a, and do so without attacking the then revealed portions of the dielectric portions 19a and 19b of the layer 19 which were previously in the bottoms of the blind holes 17 and 18. The substrate 10 then has a rear face 29 beyond which notably the portions 19a and 19b have rear parts 30a and 30b protruding relative to the rear face 29 of the substrate 10. It may be noted that the thickness e2 is equal to or less than the height h1 minus the thickness of the dielectric layer 13 and that the protruding rear part 30a is less high than the rear part 30b.

Figure 12:
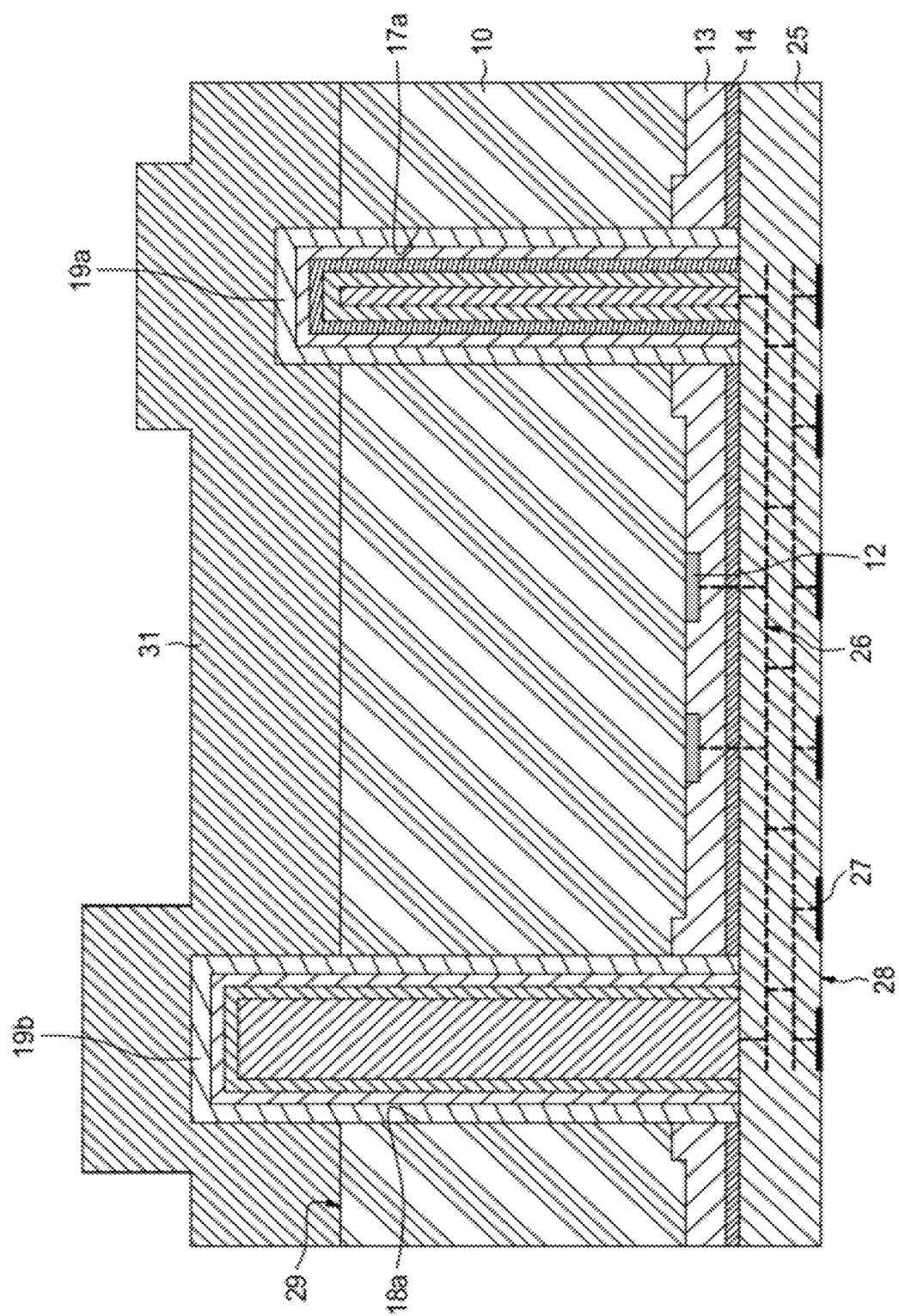

Then, as illustrated in FIG. 12, a thick layer 31 of a dielectric material, for example of silicon oxide ($SiO_2$) or of a polymer such as BenzoCycloButene (BCB), is deposited on the rear face 29 of the substrate 10, which covers or buries the protruding rear parts 30a and 30b of the remaining portions 19a and 19b protruding relative to the rear face 29 of the reduced-thickness substrate 10.

Figure 13:
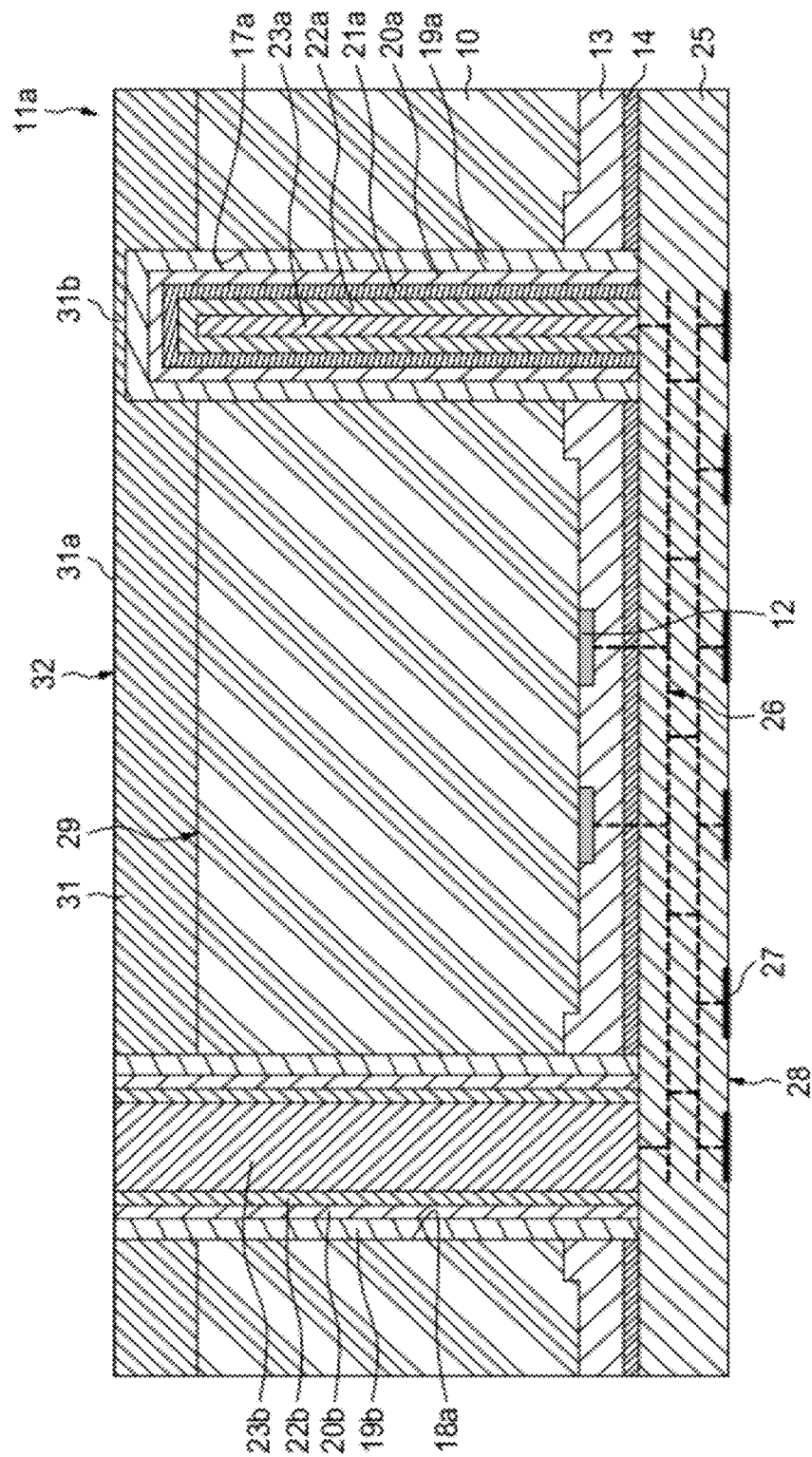

Then, as illustrated in FIG. 13, from the rear, the thickness of the dielectric layer 31 is reduced and a rear end part of the rear part 30b is removed, without, however, reaching the less high rear part 30a.

The result of this is a flat rear face 32 which is formed, in one and the same plane, by the rear face 31a of the reduced dielectric layer 31 and by the revealed rear ends of the trimmed remaining portions 19a, 20a, 22a and 23a, the trimmed remaining portions 19b, 20b, 22b and 23b now being cylindrical. The result of this is also that the rear face 31a of the reduced dielectric layer 31 passes over and at a distance from the rear part of the remaining portion 19a, leaving a leaf 31b remaining.

There is then obtained a new wafer 11a comprising the wafer 11 and the reduced rear dielectric layer 31.

The blind holes 17 and 18 and the various layers 19, 20, 21, 22 and 23, described above, and the layer 31, are of course dimensioned so that the above arrangements are achieved.

It can be observed that the ends of the portion 23b are uncovered and constitute opposed contact surfaces even if the dielectric layer 21 is previously maintained.

Then, as illustrated in FIG. 14, a secondary hole 33 is formed through the leaf 31b of the reduced dielectric layer 30a and the rear radial portion 34 of the dielectric portion 19a, axially to the main through hole 17a, by etching, so as to at least partially reveal the rear radial portion 35 of the remaining conductive portion 20a.

Then, as illustrated in FIG. 15, a rear electrical connection bonding pad 36, which fills the secondary hole 33 to be in contact with the rear radial portion 35 of the remaining conductive portion 20a, and a rear electrical connection bonding pad 37 in contact notably on the radial rear end of the central trimmed conductive cylindrical portion 23b and possibly on the rear ends of the trimmed conductive cylindrical portions 20b and 22b, may be formed on the face 31a of the dielectric rear layer 31.

As can be seen in FIG. 15, the result of the above is that the semiconductor device 1 that is obtained comprises, in the wafer 11a, on the one hand, a through capacitor 38, obtained from the initial main hole 17, and, on the other hand, an electrical connection through via 39, obtained from the initial main hole 18, defined hereinbelow.

The through capacitor 38 comprises an outer electrode 40 formed by the remaining conductive portion 20a, an inner electrode 41 formed by the adjacent remaining conductive portions 22a and 23a and a dielectric membrane 42 formed by the remaining dielectric portion 21a, the dielectric membrane 42 extending between the outer electrode 40 and the inner electrode 41.

The radial rear face 40a, situated on the rear radial portion 35, of the outer electrode 40 can be connected via the rear through the secondary rear hole 33 and the rear face 32 of the wafer 11a, according to the example described via the rear electrical connection bonding pad 36.

The radial front face 41a, situated in the front face 24 of the wafer 11a, of the inner electrode 41 can be connected via the front, according to the example described, to the front electrical connection network 26.

The radial front face 39a, situated in the front face 24 of the wafer 11a, of the electrical connection via 39, can be connected via the front, according to the example described, to the electrical connection network 26.

The radial rear face 39b, situated in the rear face 32 of the wafer 11a, of the electrical connection through via 39, can be connected via the rear, according to the example described, to the electrical connection bonding pad 37.

According to a variant embodiment, the wafer 11a could consist only of a substrate, possibly multilayer, in which the through capacitor 38 and possibly the electrical connection through via 39 would be formed.

Figure 16:
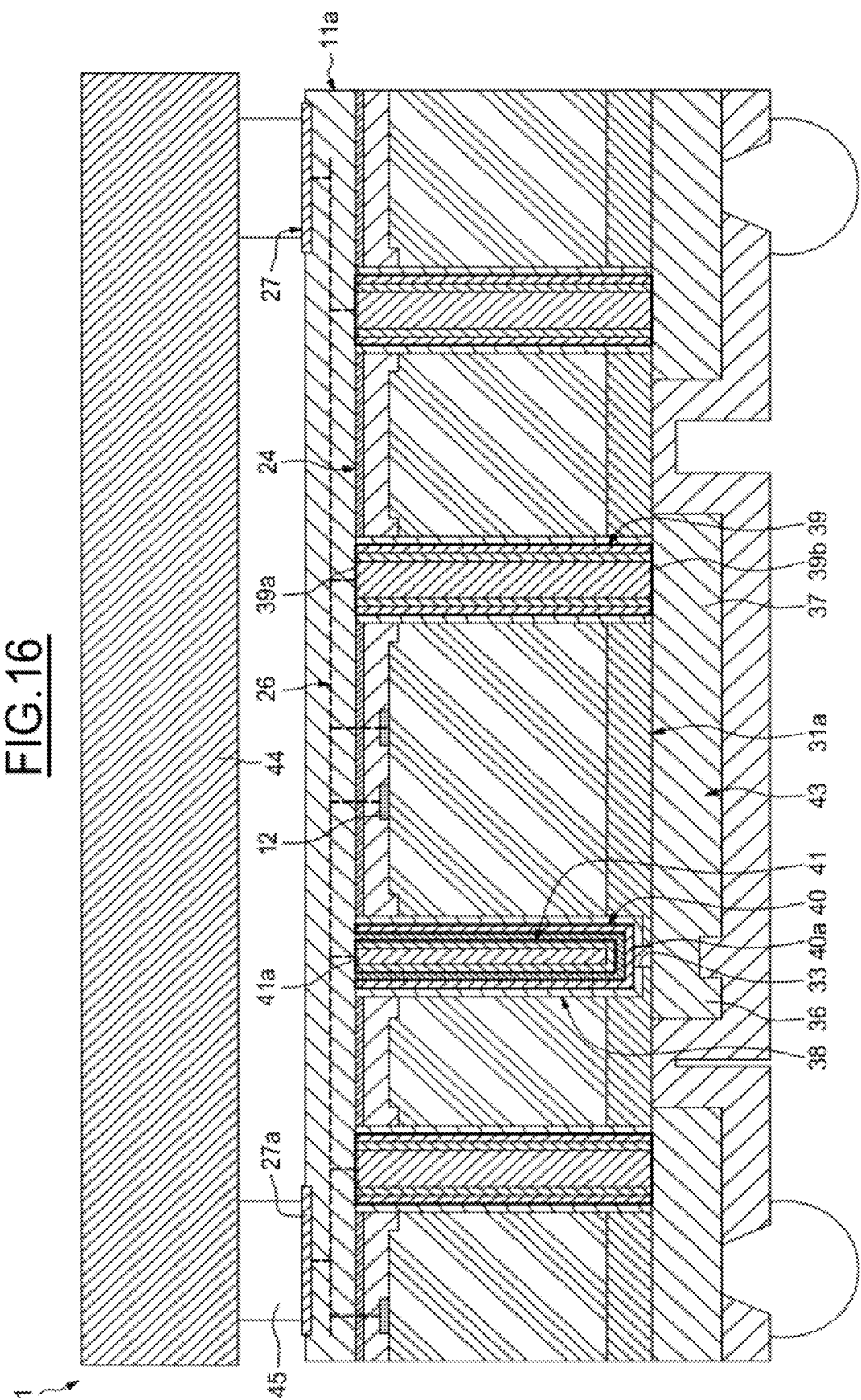
FIG. 16 shows in cross section a use of the device of FIG. 15.
Figure 17:
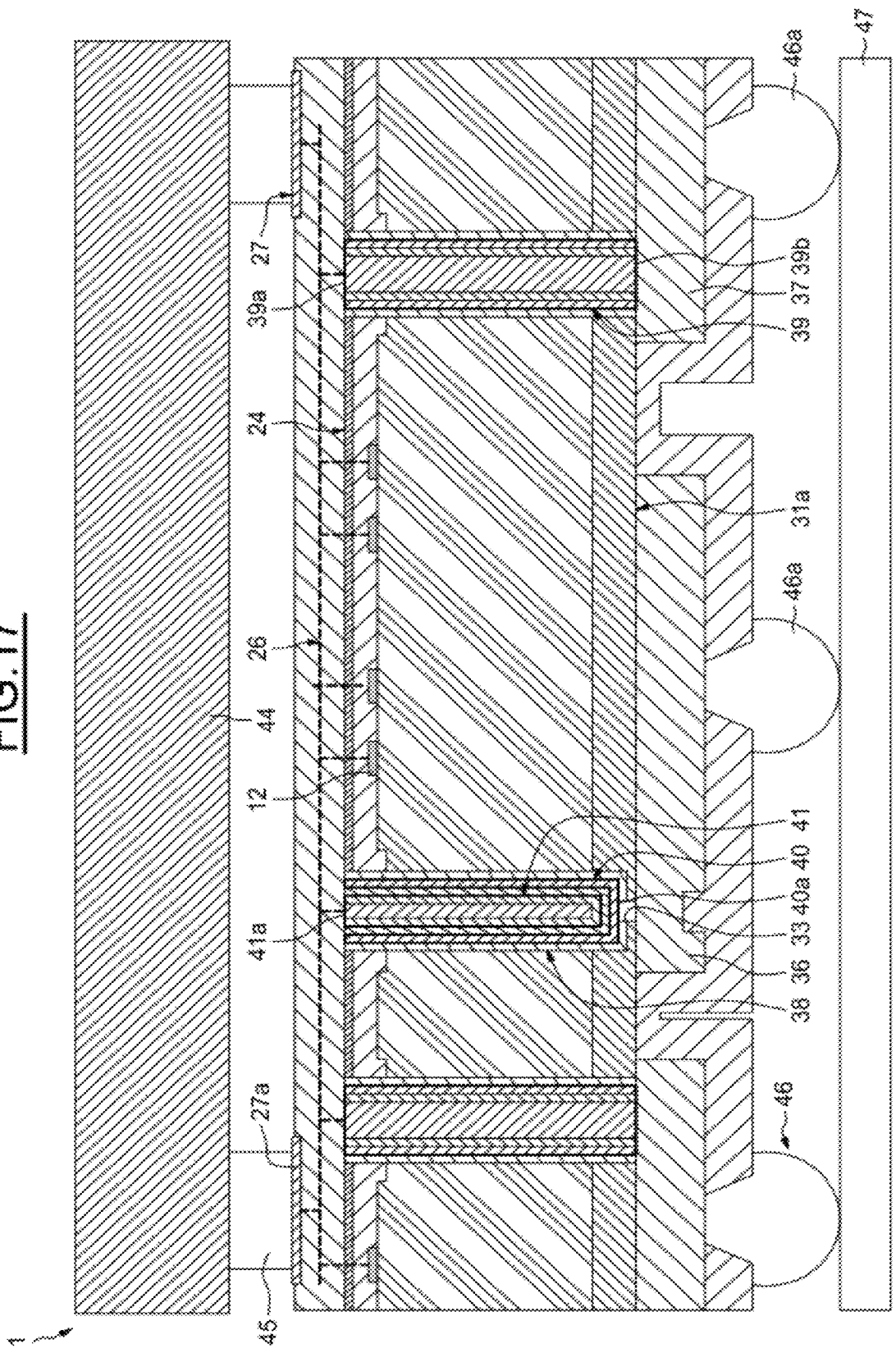
FIG. 17 shows in cross section another use of the device of FIG. 15.

Referring to FIGS. 16 to 17, there now follows a description of the examples of use of the semiconductor device 1 illustrated in FIG. 15.

As illustrated in FIG. 16, the through capacitor 38 may be arranged so that the rear electrical connection bonding pads 36 and 37 are linked so as to form a connection track 43, on the rear face 31a of the wafer 11a. Thus, the outer electrode 40 of the through capacitor 38 may be linked to the front electrical connection network 26 via the electrical connection through via 39.

In these conditions, on the one hand, the outer electrode 40 may be linked, via the electrical connection through via 39 and the connection track 43, to the integrated circuits 12 and/or to a front bonding pad 27a of the front external electrical connection bonding pads 27, the front external electrical connection bonding pads 27 being able to be linked to a complementary rear electronic device 44 via electrical connection elements 45 such as balls. Also, the inner electrode 41 may be linked to the integrated circuits 12 and/or to at least one of the front external electrical connection bonding pads 27.

Thus, the through capacitor 38 may be used by the integrated circuits 12 of the semiconductor device 1 and/or by the rear electronic device, independently of the existence of the integrated circuits 12, 44 and/or between the integrated circuits 12 of the semiconductor device 1 and the rear electronic device 44.

As illustrated in FIG. 17, the through capacitor 38 may be arranged so that the rear electrical connection bonding pad 36, not linked to the rear electrical connection bonding pad 37, is linked to a rear external electrical connection element 46a of a set of rear external electrical connection elements 46, for example balls, interposed between the semiconductor device 1 and a complementary rear electronic device 47.

In these conditions, on the one hand, the outer electrode 40 may be linked to this front electronic device 47 and, on the other hand, the inner electrode may be linked, as in the case of FIG. 16, to the integrated circuits 12 and/or to a front bonding pad 27a.

Thus, the through capacitor 38 may be used between the integrated circuits 12 of the semiconductor device 1 and the front electronic device 47 and/or between the rear electronic device 44 and the front electronic device 47, independently of the existence of the electrical connection through bonding pad 39 which can be used for other electrical connection purposes.

Furthermore, in as much as the electrical connection bonding pad 37 is linked to a rear connection element 46b and is linked to the inner electrode 41 via the front connection network 26, the through capacitor 38 may be used by the front electronic device 47, independently of the existence of the integrated circuits 12.

Generally, the semiconductor device 1 may comprise a number of through capacitors 38 and a number of electrical connection through vias, which may be fabricated as described previously. The various interconnects described above for the through capacitors may be established, through capacitors may be connected in series or in parallel, and electrical connection through vias may independently use through capacitors.

The result of the above is that, in particular, it is possible to fabricate large-size through capacitors, whose electrodes have large electrical connection surface areas and can easily be connected according to numerous configurations, while achieving low resistances in the electrical connections. It is also possible to achieve high integration densities.

According to a variant embodiment, the blind holes 17 and 18 (see FIG. 3) could have the same diameter, and consequently the same depth. In this case, the protruding parts 30*a* and 30*b* (see FIG. 11) would have the same length beyond the rear face 29 of the thinned substrate 10. The layer 31 (see FIG. 13) could be thinned to close to the ends of the protruding parts 30*a* and 30*b* of the same length. Then, another secondary hole corresponding to the secondary hole 33 (see FIG. 15) could be produced above the protruding part 30*b* to reveal it, at least partially, and another contact bonding pad corresponding to the contact bonding pad 36 could be formed through this other secondary hole on the rear face of the protruding part 30*b*.

The present invention is not limited to the examples described above. In particular, certain fabrication steps described could be organized differently and the electrical connections could be presented according to differently combined layouts. Many other variant embodiments are possible, without departing from the scope defined by the appended claims.

What is claimed is:

1. A semiconductor device comprising:
    a wafer having a front face and a rear face and in which is formed a main blind hole in its front face;
    a capacitor formed in the main blind hole which comprises:
        a conductive outer layer covering a side wall and a bottom of the main blind hole and forming an outer electrode,
        a dielectric intermediate layer covering the conductive outer layer and forming a dielectric membrane, and
        a filling conductive material, at least partially filling the main blind hole and forming an inner electrode;
    a secondary rear hole formed in the rear face of the wafer, at least partially revealing a bottom surface of the outer electrode; and
    a rear electrical connection on the rear face of the wafer and in electrical contact with the bottom surface of the outer electrode through the secondary rear hole.

2. The device according to claim 1, also comprising:
    a main through hole passing through the wafer and situated at a distance from the main blind hole containing the capacitor,
    a conductive material filling the main through hole so as to form an electrical connection through via having a front end situated in a plane of the front face of the wafer and a rear end situated in a plane of the rear face of the wafer.

3. The device according to claim 2, in which a diameter of the main through hole containing the electrical connection through via is greater than a diameter of the blind hole containing the capacitor.

4. The device according to claim 2, wherein the rear electrical connection extends to link the electrical connection through via to the outer electrode of the capacitor.

5. The device according to claim 2, further comprising a front electrical connection linking the electrical connection through via and a front external electrical connection element.

6. The device according to claim 2, further comprising a front electrical connection linking the electrical connection through via to integrated circuits formed on a surface of the wafer.

7. The device according to claim 1, also comprising:
    another main blind hole situated at a distance from the main blind hole containing the capacitor,
    a filling conductive material filling this another main hole so as to form an electrical connection via having a front end situated in a plane of the front face of the wafer,
    another secondary rear hole formed in the rear face of the wafer, at least partially revealing a bottom of the electrical connection via, and
    another rear electrical connection on the rear face of the wafer and in electrical contact with the bottom of the electrical connection via through the another secondary rear hole.

8. The device according to claim 7, wherein the further comprising a rear electrical connection extends to link the electrical connection via to the outer electrode of the capacitor.

9. The device according to claim 7, further comprising a front electrical connection linking the electrical connection via and a front external electrical connection element.

10. The device according to claim 7, further comprising a front electrical connection linking the electrical connection via to integrated circuits formed on a surface of the wafer.

11. The device according to claim 1, wherein the rear electrical connection extends to link linking the outer electrode of the capacitor to a rear external electrical connection element.

12. The device according to claim 1, further comprising a front electrical connection linking the inner electrode of the capacitor and a front external electrical connection element.

13. The device according to claim 1, in which the wafer comprises:
    a substrate on a front face of which are formed integrated circuits, and
    a dielectric layer formed on the front face of the substrate.

14. The device according to claim 13, comprising a front electrical connection linking the inner electrode of the capacitor and the integrated circuits.

15. A method for fabricating a semiconductor device containing a capacitor, comprising:
    producing a main blind hole in a front face of a wafer;
    successively depositing in the main blind hole a first conductive layer, a dielectric layer and a second conductive layer at least partially filling the main blind hole to form said capacitor;
    producing a secondary rear hole in a rear face of the wafer to at least partially reveal a bottom of the portion of the first conductive layer situated in the main blind hole; and
    forming a rear electrical connection on the rear face of the wafer and in the secondary rear hole to make electrical contact to the revealed bottom portion of the first conductive layer.

16. The method of claim 15, further comprising:
    producing a main through hole passing through the wafer and situated at a distance from the main blind hole containing the capacitor,
    filling the main through hole with a conductive material so as to form an electrical connection through via having a front end situated in a the plane of the front face of the wafer and a rear end situated in a plane of the rear face of the wafer.

17. The method of claim 16, further comprising forming said rear electrical connection on the rear face of the wafer to extend between the electrical connection through via and the revealed bottom portion of the first conductive layer.

18. The method of claim 15, further comprising:
   forming another main blind hole situated at a distance from the main blind hole containing the capacitor,
   filling the another main blind hole with a conductive material filling so as to form an electrical connection via having a front end situated in a plane of the front face of the wafer, and
   producing another secondary rear hole in the rear face of the wafer, at least partially revealing a bottom of the electrical connection via.

19. The method of claim 18, further comprising forming said rear an electrical connection on the rear face of the wafer to extend between the revealed bottom of the electrical connection via and the revealed bottom portion of the first conductive layer.

20. A method for fabricating a semiconductor device containing a capacitor, comprising:
   producing, in a front face of a wafer comprising a substrate provided with front integrated circuits and a front dielectric layer, a first main blind hole and a second main blind hole;
   successively depositing in the first main blind hole a first conductive layer, a dielectric layer and a second conductive layer at least partially filling the first main blind hole;
   at least partially filling the second main blind hole with a conductive material;
   reducing a thickness of the wafer by removing a rear portion of this wafer to transform the first and second main blind holes into first and second main holes passing through a reduced thickness wafer;
   depositing, on a rear face of the reduced thickness wafer, a dielectric rear layer;
   reducing a thickness of the dielectric rear layer to form an electrical connection via by exposing the conductive material of the second main blind hole without exposing a bottom of the portion of the first conductive layer situated in the first main blind hole;
   producing a secondary rear hole in the reduced thickness dielectric rear layer to at least partially reveal a bottom of the portion of the first conductive layer situated in the first main blind hole; and
   forming a rear electrical connection on a rear face of the reduced thickness dielectric rear layer and in the secondary rear hole to make electrical contact to the revealed bottom portion of the first conductive layer.

21. The method according to claim 20, in which the conductive material at least partially filing the second main blind hole comprises the first and second conductive layers.

22. The method according to claim 21, in which the dielectric layer does not extend into the second main blind hole.

23. The method according to claim 20, further comprising: producing front and rear electrical connections to the capacitor.

24. The method according to claim 20, further comprising: producing front and rear electrical connections to the electrical connection via.

* * * * *